(12) United States Patent
Lu et al.

(10) Patent No.: US 11,800,699 B2
(45) Date of Patent: Oct. 24, 2023

(54) SEMICONDUCTOR STRUCTURE WITH CHAMFERED CAPACITOR CONNECTION LINE ADJACENT BIT LINE AND METHOD FOR MANUFACTURING SEMICONDUCTOR STRUCTURE THEREOF

(71) Applicant: CHANGXIN MEMORY TECHNOLOGIES, INC., Hefei (CN)

(72) Inventors: Jingwen Lu, Hefei (CN); Hai-Han Hung, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 114 days.

(21) Appl. No.: 17/447,137

(22) Filed: Sep. 8, 2021

(65) Prior Publication Data
US 2022/0310624 A1 Sep. 29, 2022

Related U.S. Application Data

(63) Continuation of application No. PCT/CN2021/105936, filed on Jul. 13, 2021.

(30) Foreign Application Priority Data

Mar. 29, 2021 (CN) .......................... 202110336757.8

(51) Int. Cl.
*H01L 27/108* (2006.01)
*H10B 12/00* (2023.01)
*H01L 21/768* (2006.01)

(52) U.S. Cl.
CPC ... *H10B 12/0335* (2023.02); *H01L 21/76846* (2013.01); *H01L 21/76867* (2013.01); *H10B 12/315* (2023.02); *H10B 12/482* (2023.02)

(58) Field of Classification Search
CPC .............. H10B 12/0335; H10B 12/315; H10B 12/482; H01L 21/76846; H01L 21/76867; H01L 21/76847; H01L 21/76877
See application file for complete search history.

(56) References Cited

U.S. PATENT DOCUMENTS

| | | | |
|---|---|---|---|
| 9,425,200 | B2 | 8/2016 | Hwang et al. |
| 9,929,249 | B1 | 3/2018 | Ahn et al. |
| 10,186,597 | B2 | 1/2019 | Ahn et al. |

(Continued)

FOREIGN PATENT DOCUMENTS

| | | |
|---|---|---|
| CN | 108336017 A | 7/2018 |
| CN | 208923134 U | 5/2019 |

(Continued)

*Primary Examiner* — John P. Dulka
(74) *Attorney, Agent, or Firm* — SYNCODA LLC; Feng Ma

(57) ABSTRACT

A semiconductor structure includes a substrate, bit line structures, and capacitor connection lines. A plurality of bit line structures are arranged on the substrate. Contact holes are formed between adjacent bit line structures. A capacitor connection line includes a first conductive block and a second conductive block. The first conductive block and the second conductive block are sequentially filled in a contact hole. A chamfered structure is formed on a top end of the first conductive block. The chamfered structure is adjacent to a bit line structure. A bottom end of the second conductive block matches the chambered structure.

16 Claims, 16 Drawing Sheets

(56) References Cited

U.S. PATENT DOCUMENTS

| | | |
|---|---|---|
| 10,411,014 B2 | 9/2019 | Hwang et al. |
| 2015/0126013 A1 | 5/2015 | Hwang et al. |
| 2016/0329337 A1 | 11/2016 | Hwang et al. |
| 2018/0182861 A1 | 6/2018 | Ahn et al. |
| 2019/0348418 A1 | 11/2019 | Hwang et al. |

FOREIGN PATENT DOCUMENTS

| | | | | |
|---|---|---|---|---|
| CN | 110718550 A | | 1/2020 | |
| CN | 112447604 A | * | 3/2021 | ......... H01L 21/7682 |
| CN | 112447604 A | | 3/2021 | |
| CN | 112466847 A | | 3/2021 | |
| CN | 113097209 A | | 7/2021 | |

\* cited by examiner

US 11,800,699 B2

SEMICONDUCTOR STRUCTURE WITH CHAMFERED CAPACITOR CONNECTION LINE ADJACENT BIT LINE AND METHOD FOR MANUFACTURING SEMICONDUCTOR STRUCTURE THEREOF

CROSS-REFERENCE TO RELATED APPLICATIONS

This application is a continuation application of International Application No. PCT/CN2021/105936 filed on Jul. 13, 2021, which claims priority to Chinese Patent Application No. 202110336757.8 filed on Mar. 29, 2021. The disclosures of these applications are hereby incorporated by reference in their entirety.

BACKGROUND

A Dynamic Random-Access Memory (DRAM) is a common semiconductor memory device in a computer. The DRAM generally includes a capacitor structure and a transistor structure. The transistor structure is connected to the capacitor structure, such that data stored in the capacitor structure can be read through the transistor structure or data can be written into the capacitor structure.

SUMMARY

Embodiments of this disclosure relate generally to the field of semiconductor technologies, and more specifically to a semiconductor structure and a method for manufacturing the semiconductor structure.

In a first aspect, the embodiment of this disclosure provides a semiconductor structure, including: a substrate, bit line structures and capacitor connection lines. The bit line structures are arranged on the substrate and extend on a top surface of the substrate. The pluralities of bit line structures are disposed in parallel and spaced apart from each other on the top surface of the substrate. Contact holes are formed between adjacent bit line structures.

A capacitor connection line includes a first conductive block and a second conductive block. The first conductive block and the second conductive block are sequentially filled in a contact hole. A chamfered structure is formed on a top end of the first conductive block. The chamfered structure is adjacent to a bit line structure. A bottom end of the second conductive block matches the chambered structure.

In a second aspect, the embodiment of this disclosure provides a method for manufacturing the semiconductor structure, including the following operations.

A substrate is provided. Bit line structures are forming on the substrate, in which the bit line structures extending on a top surface of the substrate, The bit line structures are disposed in parallel and spaced apart from each other on the top surface of the substrate, and contact holes are formed between adjacent bit line structures. A first conductive block is formed in a contact hole, in which a chamfered structure is formed on a top end of the first conductive block, and is adjacent to a bit line structure. A second conductive block is formed in the contact hole, which is located on the top end of the first conductive block, in which a bottom end of the second conductive block matches the chamfered structure.

The method for manufacturing the semiconductor structure provided by the embodiment of this disclosure is used for manufacturing the above said semiconductor structure.

DETAILED DESCRIPTION

Figure 1:
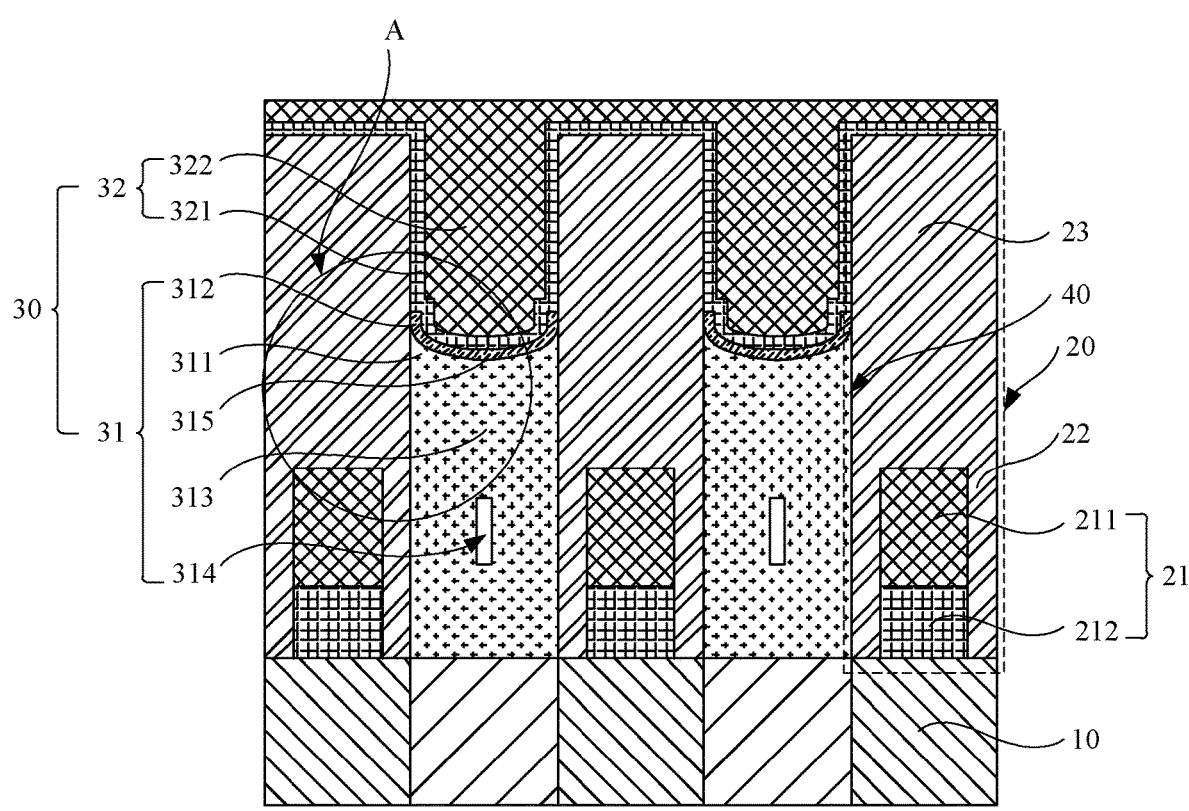
FIG. 1 is a schematic sectional view of a semiconductor structure according to an embodiment of this disclosure.

A transistor structure typically includes a substrate and bit line structures arranged on the substrate. A plurality of bit line structures are disposed in parallel and spaced apart from each other. A bit line is provided in a bit line structure. A capacitor connection line is filled between adjacent bit line structures. One end of the capacitor connection line is connected to the transistor structure in the substrate, and the other end of the capacitor connection line is connected to the capacitor structure, so as to achieve a connection between the capacitor structure and the transistor structure. The capacitor connection line includes a first conductive block and a second conductive block that are sequentially stacked along a direction perpendicular to the substrate. The second conductive block is connected to the capacitor structure, and the first conductive block is connected to the transistor structure in the substrate. However, parasitic capacitance is prone to occur between the second conductive block and the bit line, and leakage current is prone to occur.

Specifically, in an example, a DRAM generally includes capacitor structures and transistor structures. The transistor structures are formed in a substrate. A plurality of bit line structures are further formed on the substrate. The plurality of bit line structures are disposed in parallel and spaced apart from each other. Bit lines configured to conduct electricity are provided in bit line structures. Capacitor connection lines are filled between adjacent bit line structures. One end of a capacitor connection line is connected to a transistor structure in the substrate, and the other end of the capacitor connection line is connected to a capacitor structure, so as to achieve an electrical connection between the capacitor structure and the transistor structure. A capacitor connection line includes a first conductive block and a second conductive block that are sequentially stacked along a direction perpendicular to the substrate. The first conductive block is connected to a transistor structure in the substrate, and the second conductive block is connected to a capacitor structure.

A bottom end of the second conductive block is in direct contact with a top end of the first conductive block, and a sidewall of the second conductive block is in direct contact with a sidewall of the bit line structure, such that a distance between the second conductive block and the bit line is small. Parasitic capacitance is prone to occur, and leakage current is prone to occur. Especially when the manufacturing process is scaled down, the distance between the second conductive block and the bit line will be further reduced, thereby reducing the performance of the DRAM.

In the semiconductor structure and the method for manufacturing the semiconductor structure of the embodiments of this disclosure, a chamfered structure is provided between the first conductive block and the second conductive block. The second conductive block is in contact with the first conductive block by means of the chamfered structure. A portion of the second conductive block is in contact with the bit line structure through the chamfered structure. Compared with a direct contact between the second conductive block and the first conductive block as well as a direct contact between the second conductive block and the bit line structure in the related art, the distance between the second conductive block and the bit line structure is increased, thereby increasing the distance between the second conductive block and the bit line, preventing generation of parasitic capacitance between the second conductive block and the bit line structure, preventing occurrence of leakage current between the second conductive block and the bit line structure, and improving the performance of the semiconductor structure of the embodiment of this disclosure.

In one aspect, this embodiment provides a semiconductor structure. The semiconductor structure may be a DRAM. Of course, the semiconductor structure may also be any other device.

With reference to FIG. 1, the semiconductor structure includes a substrate 10, bit line structures 20, and capacitor connection lines 30. The bit line structures 20 are arranged on the substrate 10. There are pluralities of bit line structures 20 that are projected from a top surface of the substrate 10. The plurality of bit line structures 20 extend on the top surface of the substrate 10 and are disposed in parallel and spaced apart from each other. The capacitor connection lines 30 are filled in adjacent bit line structures 20.

It should be noted that the top surface of the substrate 10 is an upper surface of the substrate 10, as shown in FIG. 1.

A material of the substrate 10 can include silicon, germanium, etc. Transistors and word line structures, etc., can also be formed in the substrate 10. In an implementation that the semiconductor structure is the DRAM, the capacitor connection lines 30 can connect capacitor structures to the transistors in the substrate 10, so as to implement the reading or writing of data in the capacitor structures through the transistors.

The bit line structures 20 are arranged on the substrate 10. With reference to FIG. 1, the bit line structures 20 are projected from the top surface of the substrate 10. The bit line structures 20 extend on the top surface of the substrate 10 and are elongated. There is a plurality of bit line structures 20. The plurality of bit line structures 20 are disposed in parallel and spaced apart from each other on the top surface of the substrate 10. Contact holes 40 are formed between adjacent bit line structures 20. The contact holes 40 are configured to accommodate the capacitor connection lines 30. That is to say, the capacitor connection lines 30 are inserted into the contact holes 40 so as to connect the capacitor structures and the transistors located in the substrate 10.

In some embodiments, the semiconductor structure further includes insulating structures. The insulating structures are formed on the top surface of the substrate 10. The insulating structures are filled between the adjacent bit line structures 20. The contact holes 40 defined by the insulating structures and the bit line structures 20 and expose the substrate 10. One end of a capacitor connection line 30 is inserted into a contact hole 40 and is in conductive contact with the substrate 10. The other end of the capacitor connection line 30 is connected to a capacitor structure so as to achieve a connection between the transistor structure and the capacitor structure. A material of the insulating structures can include silicon oxide, silicon oxynitride, or silicon nitride, etc.

With reference to FIG. 1, a bit line structure 20 includes a bit line 21, an insulating block 23, and an insulating sidewall 22. The bit line 21 is provided on the top surface of the substrate 10, and extends on the top surface of the substrate 10. The insulating block 23 covers a top end of the bit line 21. The insulating sidewall 22 covers a side surface of the bit line 21 perpendicular to the substrate 10. Through such a configuration, the bit line 21 is wrapped with the insulating sidewall 22 and the insulating block 23, thereby being capable of protecting the bit line 21, and avoiding oxidation of the bit line 21 in direct contact with outside air. As shown in FIG. 1, the top end of the bit line 21 is an upper end surface of the bit line 21.

Furthermore, the insulating sidewalls 22 further cover side surfaces of the insulating blocks 23 perpendicular to the substrate 10. The insulating sidewalls 22 that are close to each other in the adjacent bit line structures 20 define the contact hole 40. The materials of the insulating sidewalls 22 and the insulating blocks 23 can be identical, such that the insulating blocks 23 and the insulating sidewalls 22 can be an integral structure, thereby improving the strength of the bit line structures 20.

Exemplarily, a material of the insulating sidewalls 22 and the insulating blocks 23 are an insulating material, such as silicon oxide, silicon oxynitride, or silicon nitride.

In some embodiments, a gap is in the insulating sidewall 22. An insulating filler is filled in the gap. A material of the insulating filler is different from that of the insulating sidewall 22. The insulating performance of the insulating sidewall 22 can be improved through such a configuration.

In some implementations, the bit line 21 can include a metal block 211 and an auxiliary block 212. The auxiliary block 212 is located on the top surface of the substrate 10, and a bottom end of the auxiliary block 212 is in contact with the top surface of the substrate 10. The metal block 211 is located above the auxiliary block 212, and a bottom end of the metal block 211 is in contact with a top end of the auxiliary block 212. A material of the metal block 211 can include a conductive metal, such as copper, gold, silver, and tungsten. A material of the auxiliary block 212 can include a metal nitride, such as titanium nitride.

It should be noted that the bottom end of the auxiliary block 212 is a lower end surface of the auxiliary block 212, as shown in FIG. 1, and the top end of the auxiliary block 212 is an upper end surface of the auxiliary block 212, as shown in FIG. 1; and the bottom end of the metal block 211 is a lower end surface of the metal block 211, as shown in FIG. 1, and a top end of the metal block 211 is an upper end surface of the metal block 211, as shown in FIG. 1.

The capacitor connection line 30 is inserted into the contact hole 40. A bottom end of the capacitor connection line 30 is connected to the transistor in the substrate 10 corresponding to the contact hole 40, and the other end of the capacitor connection line 30 is configured to connect the capacitor structure. With reference to FIG. 1, the capacitor connection line 30 includes a first conductive block 31 and a second conductive block 32. The first conductive block 31 and the second conductive block 32 are sequentially filled in the contact hole 40. That is to say, the first conductive block 31 is located at a lower portion of the second conductive block 32. A bottom end of the first conductive block 31 is in contact with a top end of the substrate 10. A chamfered structure 311 is formed on a top end of the first conductive block 31. The chamfered structure 311 is adjacent to the bit line structure 20. A bottom end of the second conductive block 32 matches the chambered structure 311. A material of the first conductive block 31 can include polysilicon, etc.

It should be noted that the feature that the first conductive block 31 is located at the lower portion of the second conductive block 32 is that the first conductive block 31 is located below the second conductive block 32, as shown in FIG. 1; the bottom end of the first conductive block 31 is a lower end surface of the first conductive block 31, as shown in FIG. 1; and the top end of the first conductive block 31 is an upper end surface of the first conductive block 31, as shown in FIG. 1. The bottom end of the second conductive block 32 is a lower end surface of the second conductive block 32, as shown in FIG. 1.

In the semiconductor structure provided by the embodiment of this disclosure, the plurality of bit line structures 20 are arranged on the top surface of the substrate 10. The plurality of bit line structures 20 are disposed in parallel and spaced apart from each other. The contact holes 40 are formed between the adjacent bit line structures 20. A capacitor connection line 30 includes the first conductive block 31 and the second conductive block 32. The first conductive block 31 and the second conductive block 32 are sequentially filled in the contact hole 40. The top end of the first conductive block 31 is provided with the chamfered structure 311 that is adjacent to the bit line structure 20. The second conductive block 32 matches the chambered structure 311. With reference to FIG. 1, the top end of the first conductive block 31 has a curved surface that is downwardly recessed, the chamfered structure 311 is formed at a junction position between the curved surface and the first conductive block, and the chamfered structure 311 is adjacent to the bit line structure 20, thereby being capable of increasing a distance between the second conductive block 32 and the bit line 21, avoiding forming parasitic capacitance between the second conductive block 32 and the bit line 21, preventing producing leakage current between the second conductive block 32 and the bit line 21, and further improving the performance of the semiconductor structure.

Figure 2:
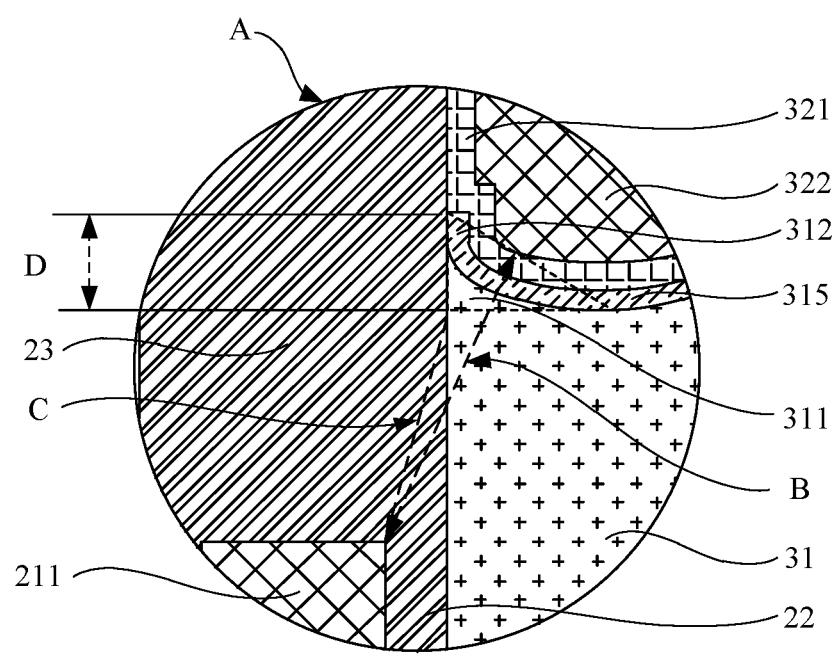
FIG. 2 is an enlargement view of part A of the semiconductor structure of FIG. 1.

With reference to FIG. 2, in this embodiment, the chamfered structure 311 is provided on the first conductive block 31, such that the distance between the second conductive block 32 and the bit line 21 is B. However, in the related art, the second conductive block 32 is in direct contact with the first conductive block 31, and the distance between the second conductive block 32 and the bit line 21 is C. In view of the above, in this embodiment, the chamfered structure 311 is provided on the first conductive block 31, thereby increasing the distance between the second conductive block 32 and the bit line 21.

In the described implementation, a distance between the top end of the bit line 21 and the top surface of the substrate 10 is smaller than a distance between the top end of the first conductive block 31 and the top surface of the substrate 10. By taking the direction shown in FIG. 1 as an example, the described configuration can make the second conductive block 32 be located above the bit line 21.

In some embodiments, the chamfered structure 311 can be a chamfered rounded angle or a chamfered right angle. Of course, the chamfered structure can be the structure of an approximate chamfered rounded angle or chamfered right angle. The structure only needs to increase the distance between the bit line 21 and the second conductive block 32.

With reference to FIG. 1, the chamfered structure 311 further has a transition wall 312. The transition wall 312 is located at a top end of the chamfered rounded angle. The transition wall 312 is adjacent to the insulating sidewall 22 of the bit line structure 20. The chamfered structure 311 and the first conductive block 31 are an integral structure. The transition wall 312 can increase a contact area between the first conductive block 31 and the second conductive block 32, and further reduce contact resistance between the first conductive block 31 and the second conductive block 32.

Exemplarily, a distance between a top end of the transition wall 312 and the top end of the first conductive block 31 is ⅓-½ of a distance between the adjacent bit line structures 20. With reference to FIG. 2, the distance between the top end of the transition wall 312 and the top end of the first conductive block 31 is D, the distance between the adjacent bit line structures 20 is a width of the contact hole 40, and D is ⅓-½ of the width of the contact hole 40.

A doped dopant is doped into the transition wall 312, the chamfered structure 311, and the top end of the first conductive block 31, so as to form a contact layer 315 that is in contact with the second conductive block 32. The contact layer 315 can reduce the contact resistance between the second conductive block 32 and the first conductive block 31. Exemplarily, the doped dopant includes phosphorus ions or arsenic ions.

With reference to FIG. 1, in some embodiments of this disclosure, the second conductive block 32 can include a conductive auxiliary layer 321 and a conductive plug 322. The conductive auxiliary layer 321 covers the top end of the first conductive block 31, the chamfered structure 311, and the transition wall 312, and covers a sidewall of the contact hole 40. The conductive plug 322 is formed on the conductive auxiliary layer 321 and fills the contact hole 40. The conductive auxiliary layer 321 is configured to block the conductive plug 322 and the first conductive block 31 from interpenetrating.

Exemplarily, a material of the conductive plug 322 can include tungsten, etc. A material of the conductive auxiliary layer 321 can include titanium nitride, etc.

Figure 3:
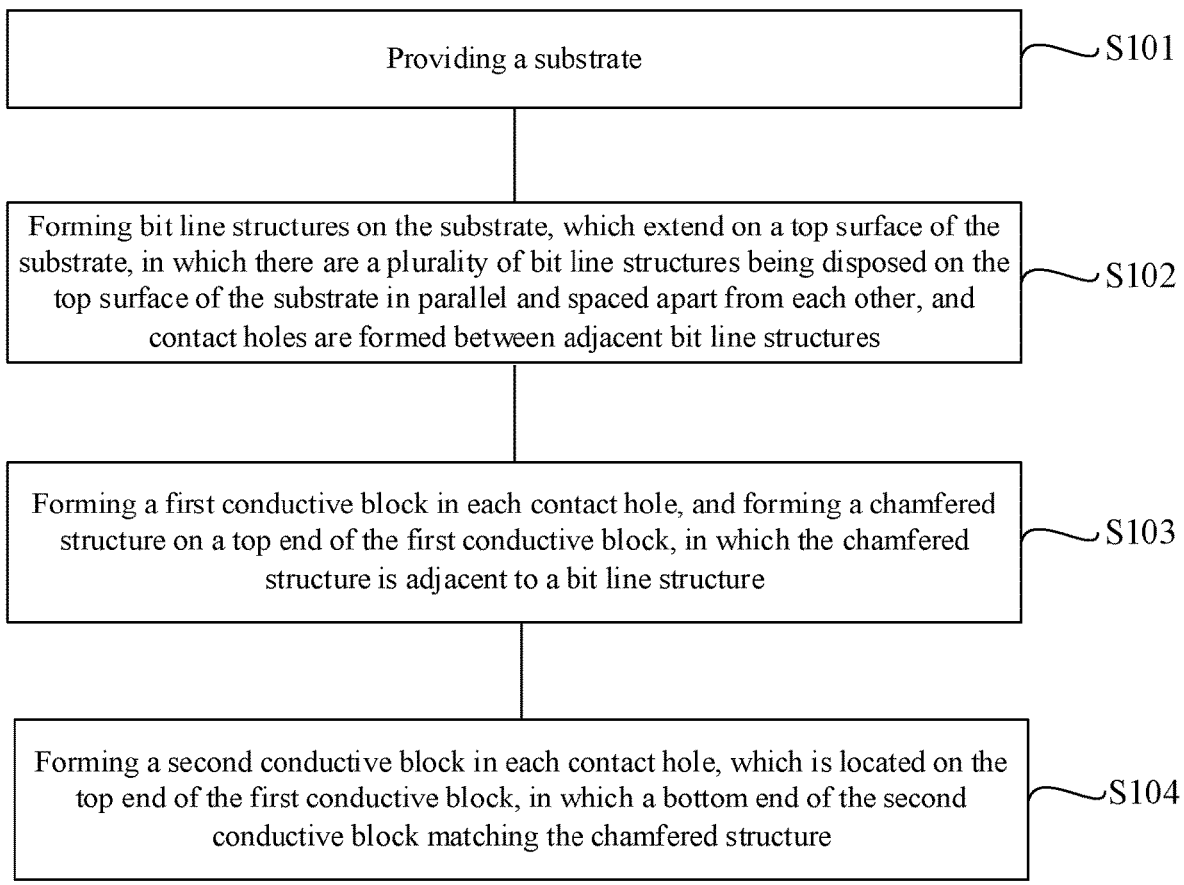
FIG. 3 is a flowchart of a method for manufacturing the semiconductor structure according to an embodiment of this disclosure.

The embodiments of this disclosure further provide a method for manufacturing the semiconductor structure. With reference to FIG. 3, the method for manufacturing the semiconductor structure according to the embodiments of this disclosure includes the following steps.

In S101, a substrate is provided.

Figure 4:
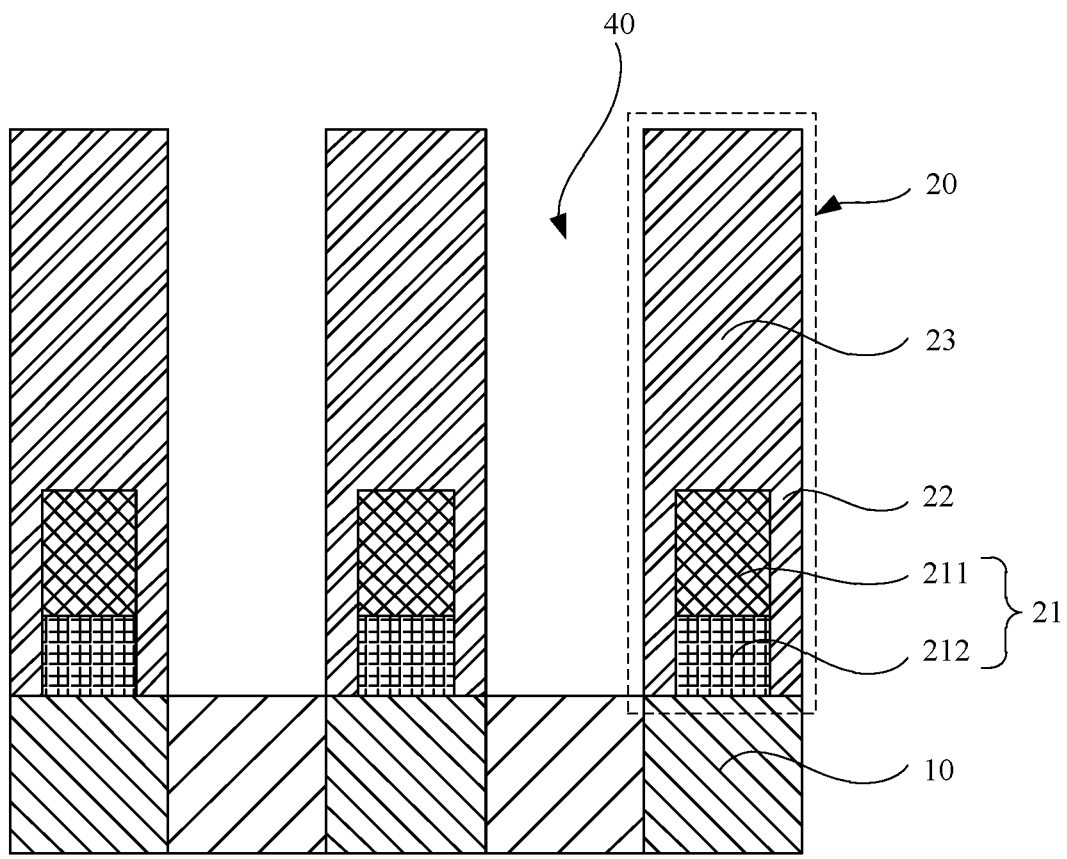
FIG. 4 is a schematic view of forming a bit line structure on a substrate in a method for manufacturing the semiconductor structure according to an embodiment of this disclosure.

As shown in FIG. 4, a material of the substrate 10 can include silicon, germanium, etc. A transistor and a word line structure, etc., can further be pre-formed in the substrate 10.

In S102, bit line structures are formed on the substrate. The bit line structures extend on a top surface of the substrate. There are pluralities of bit line structures that are disposed in parallel and spaced apart from each other on the top surface of the substrate. Contact holes are formed between adjacent bit line structures.

With reference to FIG. 4, a bit line structure 20 includes a bit line 21, an insulating block 23, and an insulating sidewall 22. The insulating block 23 is located on a top end of the bit line 21. The insulating sidewall 22 covers a side surface of the bit line 21 and a side surface of the insulating block 23. A contact hole 40 is formed between adjacent bit line structures 20. The bit line 21 includes a metal block 211 and an auxiliary block 212. A method for forming a bit line structure 20 on a substrate 10 includes the following steps.

On the substrate 10, a bit line layer and an insulating layer that are sequentially stacked are formed. The bit line layer and the insulating layer are sequentially deposited on the substrate 10. The bit line layer includes a metal layer. In some embodiments, in order to prevent the metal layer and the substrate 10 from interpenetrating, the bit line layer further includes an auxiliary layer. The auxiliary layer covers the substrate 10. The metal layer covers the auxiliary layer. The auxiliary layer and the metal layer form the bit line layer. The insulating layer covers the metal layer. A material of the auxiliary layer can include a metal nitride, such as titanium nitride. A material of the metal block can include a conductive metal, such as copper, gold, silver, and tungsten. A material of the insulating layer can include a nitride, an oxide, and a nitrogen oxide, such as silicon nitride. A chemical vapor deposition method can be selected as a deposition method.

The bit line layer and the insulating layer are etched along a direction perpendicular to the substrate 10, so as to form, on the substrate 10, a plurality of bit lines 21 that are disposed in parallel and spaced apart from each other, and the insulating blocks 23 covering the bit lines 21. The bit line layer includes the metal layer. The metal blocks 211 are obtained after the bit line layer is etched. A metal block 211 is located between the substrate 10 and a insulating block 23. In some embodiments, the bit line layer further includes the auxiliary layer. The auxiliary block 212 is obtained after the bit line layer is etched. The auxiliary block 212 is located between the metal blocks 211 and the substrate 10. The auxiliary block 212, the metal blocks 211, and the insulating blocks 23 are sequentially stacked. Dry etching is selected as an etching method. The insulating layer, the metal layer, and the auxiliary layer are synchronously etched, so as to improve the etching efficiency.

A insulating sidewall 22 is formed on a side surface of a bit line 21 and a side surface of a insulating block 23. The insulating material is deposited on the side surface of the bit line 21 and the side surface of the insulating block 23, so as to form the insulating sidewall 22 that covers the side surface of the bit line 21 and the side surface of the insulating block 23. The insulating sidewall 22 and the insulating block 23 surround the bit line 21. The bit line 21 includes the metal block 211. The insulating sidewall 22 covers a side surface of the metal block 211. In some embodiments, the bit line 21 further includes the auxiliary block 212. The auxiliary block 212 is located at a bottom end of the metal block 211. The insulating sidewall 22 covers the side surface of the metal block 211 and covers the side surface of the auxiliary block 212. The insulating sidewall 22 and the insulating block 23 surround the metal block 211 and the auxiliary block 212. A material of the insulating sidewall 22 can include a nitride, an oxide, or a nitrogen oxide, such as silicon nitride. The chemical vapor deposition method can be selected as the deposition method.

Figure 5:
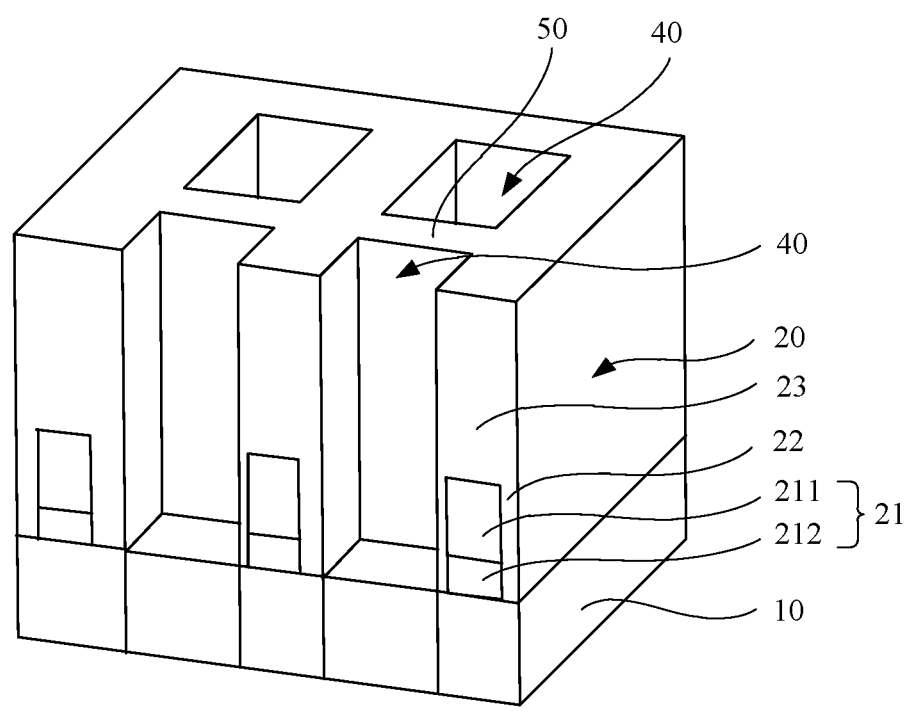
FIG. 5 is a perspective view of forming a bit line structure on a substrate in FIG. 4.

In some embodiments, the contact holes 40 are formed between the opposite insulating sidewalls 22 on the adjacent bit line structures 20. Exemplarily, with reference to FIG. 5, insulating structures 50 are further formed between the adjacent bit line structures 20 after the bit line structures 20 are formed. The insulating structures 50 and the bit line structures 20 define the contact holes 40 which expose the substrate 10. A material of the insulating structure 50 can include a nitride, an oxide, and a nitrogen oxide, such as silicon nitride.

In S103, a first conductive block is formed in a contact hole, a chamfered structure is formed on the top end of the first conductive block, and the chamfered structure is adjacent to the bit line structure.

Figure 6:
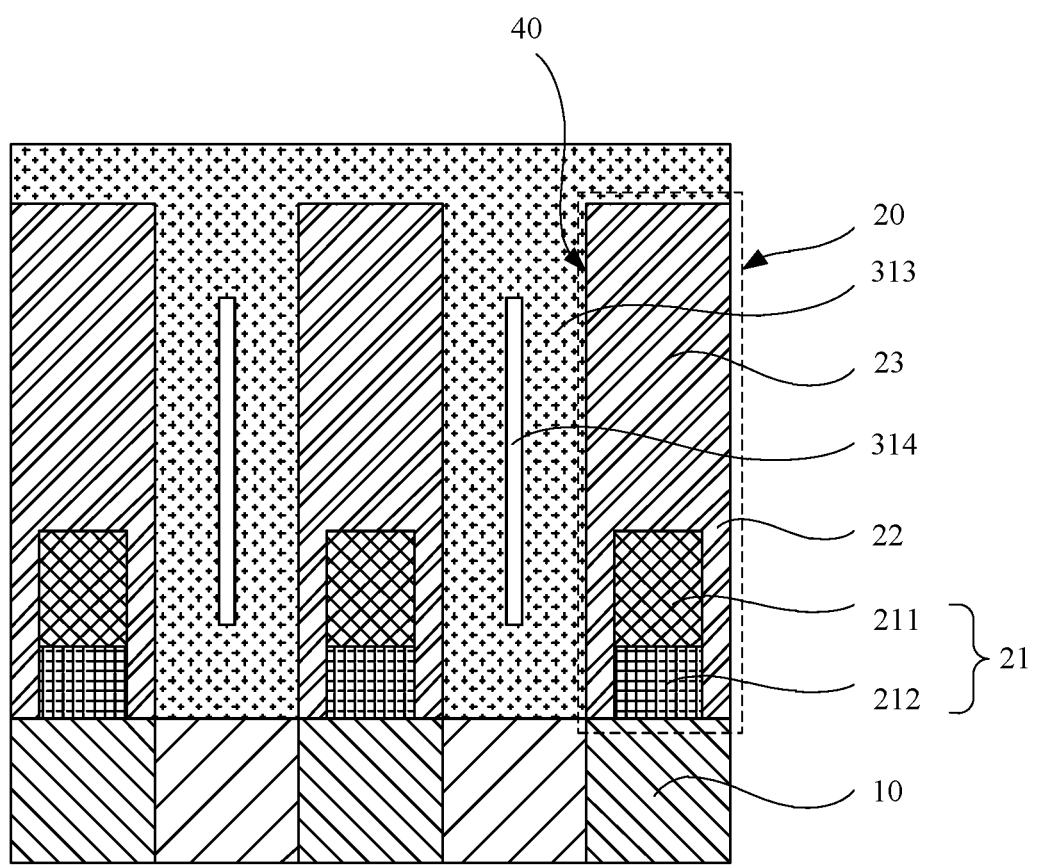
FIG. 6 is a schematic view of filling a conductive material in a contact hole in a method for manufacturing the semiconductor structure according to an embodiment of this disclosure.
Figure 7:
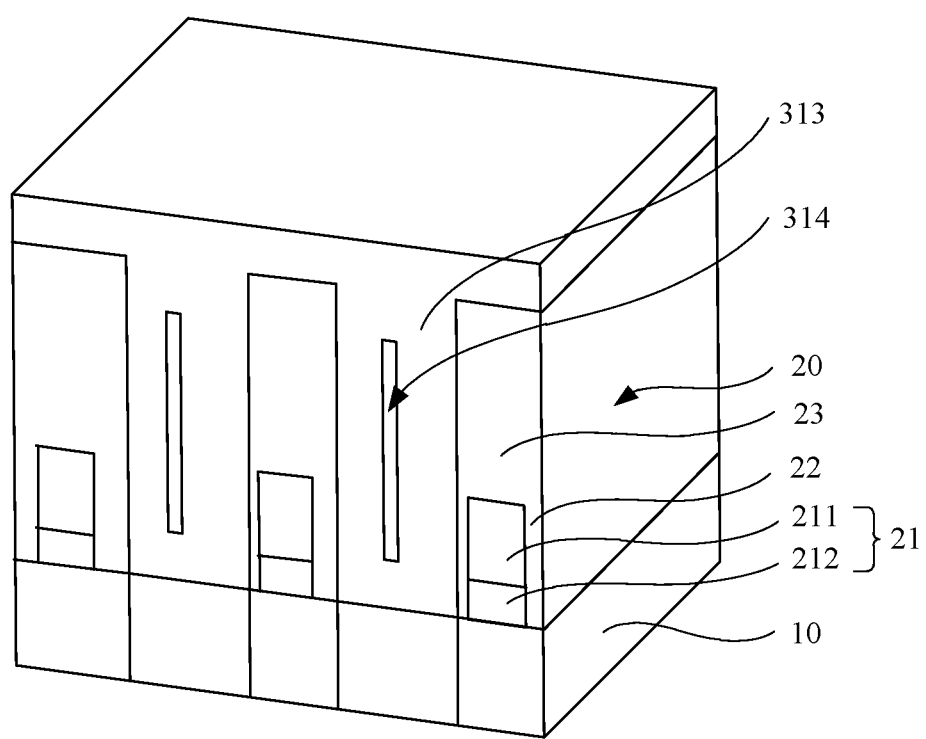
FIG. 7 is a perspective view of filling a conductive material in a contact hole in FIG. 6.

With reference to FIG. 6 and FIG. 7, the specific steps of forming the first conductive block 31 in the contact hole 40 can include: filling a conductive material 313 in the contact hole 40, such that the contact hole 40 is filled up with the conductive material 313 and a seam 314 being formed in the conductive material 313. In some embodiments, a low pressure chemical vapor deposition method or any other method having good step coverage is selected as a method of filling the conductive material 313. Di silane or a silane gas having a methylpropyl structure (H3 SiN(C3H7)2/Si2H6/SiH[N(CH3)2]3) is selected as a reaction gas. A temperature is 380-500° C. Pressure is 1-3 Torr. In order to guarantee fill uniformity, a seed crystal layer can be first deposited, and then the conductive material 313 is formed. In some embodiments, the conductive material 313 can be polysilicon having a doped dopant. The doped dopant can be selected from phosphorus ions or arsenic ions. A method of stacking and doping the polysilicon and the doped dopant can be selected as a doping method, and a method of sputtering the doped dopant to a surface of the conductive material 313 and then performing annealing can also be selected as the doping method.

Figure 8:
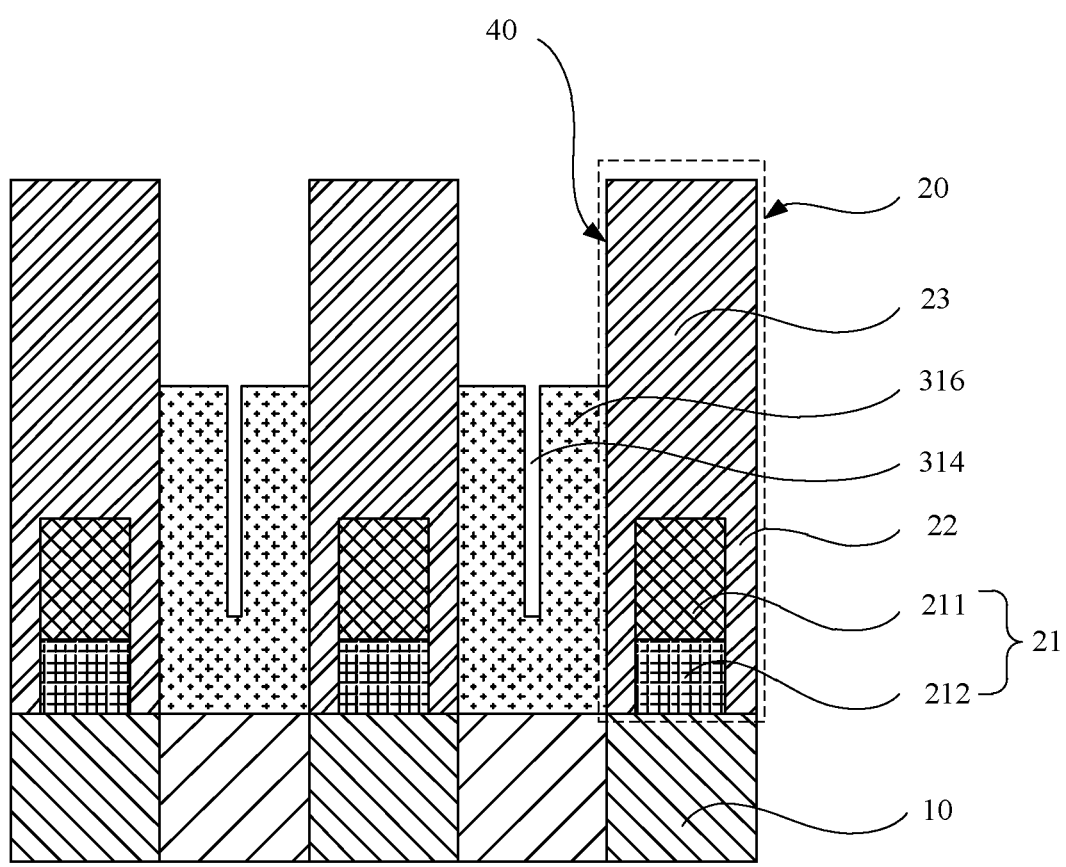
FIG. 8 is a schematic view of removing a portion of a conductive material in a method for manufacturing the semiconductor structure according to an embodiment of this disclosure.
Figure 9:
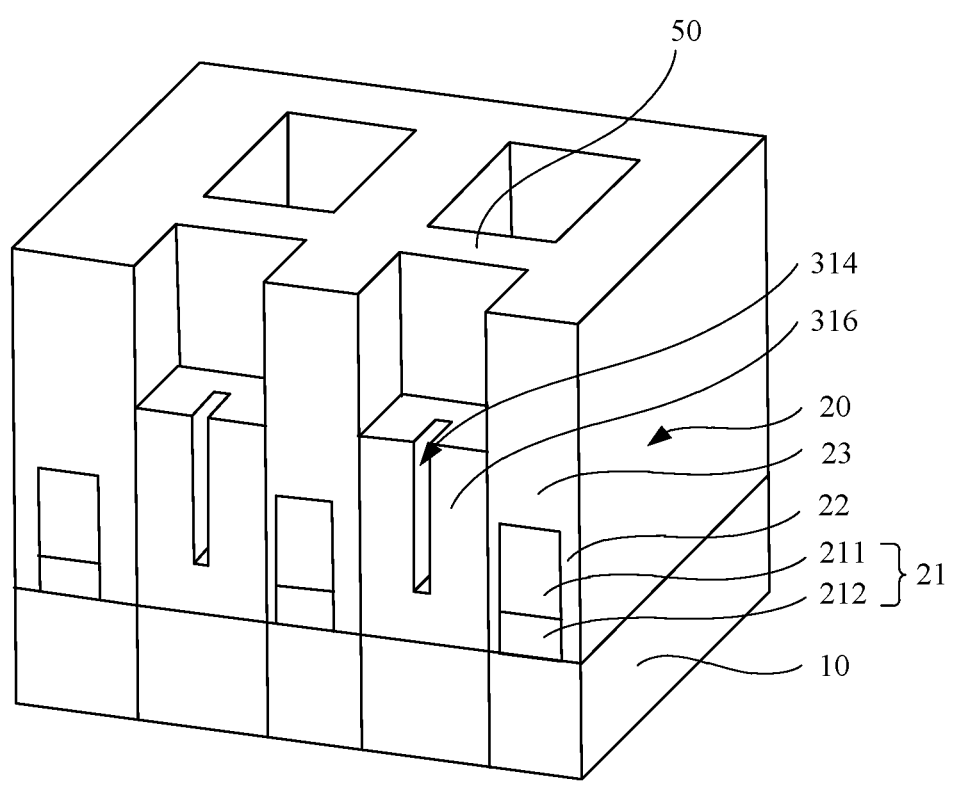
FIG. 9 is a perspective view of removing a portion of a conductive material in FIG. 8.

With reference to FIG. 8 and FIG. 9, after the conductive material 313 is formed, a portion of the conductive material 313 is removed to expose a portion of the seam 314, so as to form an intermediate first conductive block 316 located in the contact hole 40. Dry etching can be selected as a method of removing a portion of the conductive material 313.

Figure 10:
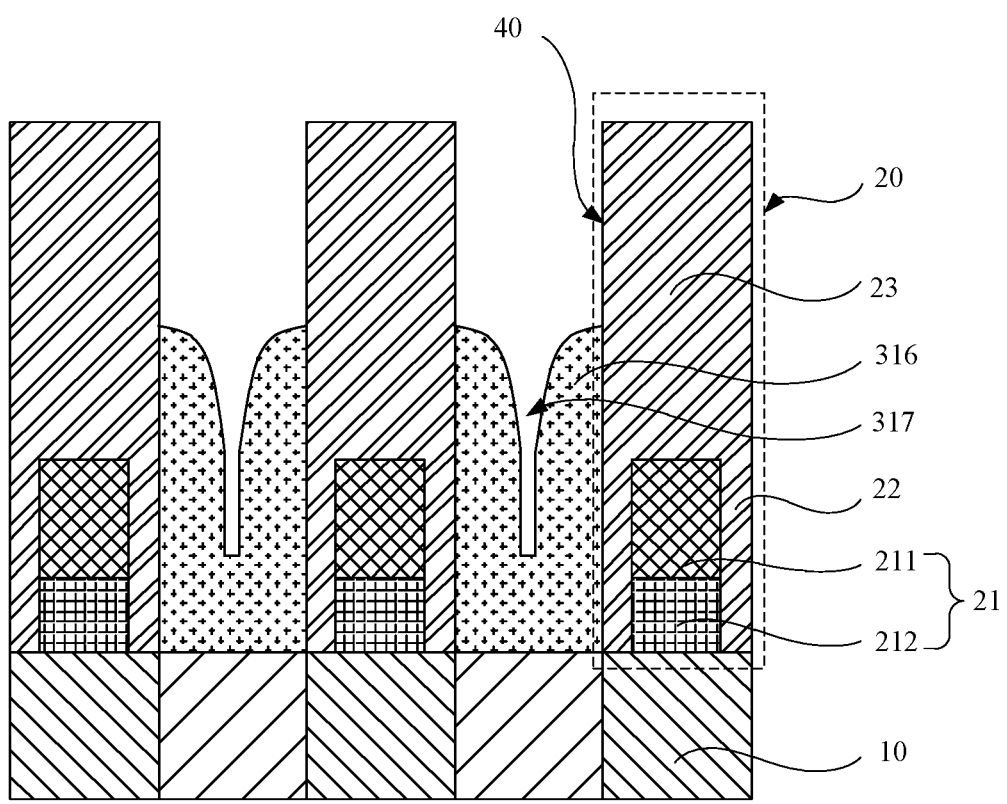
FIG. 10 is a schematic view of forming a flaring structure in a method for manufacturing the semiconductor structure according to an embodiment of this disclosure.

With reference to FIG. 10, a top portion of the intermediate first conductive block 316 is etched to form a flaring structure 317 on a top portion of the seam 314 distant from the substrate 10. Exemplarily, wet etching can be selected as the etching method.

Figure 11:
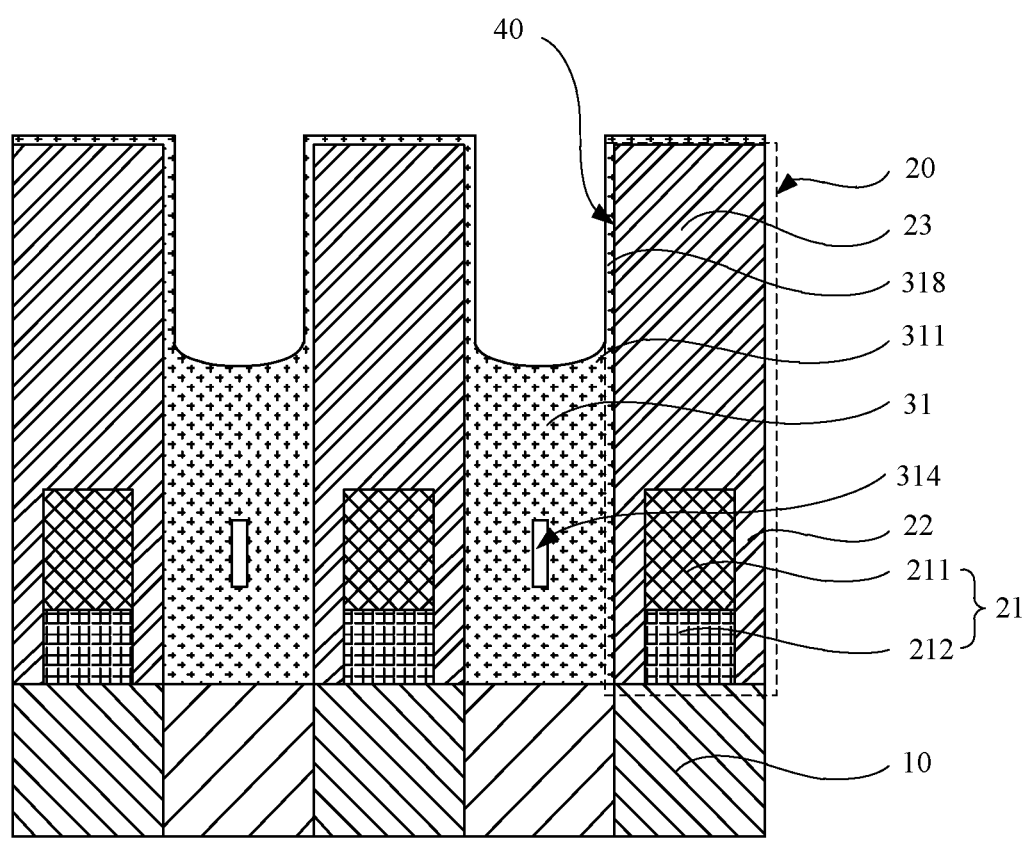
FIG. 11 is a schematic view of forming a conductive cover layer in a method for manufacturing the semiconductor structure according to an embodiment of this disclosure.
Figure 12:
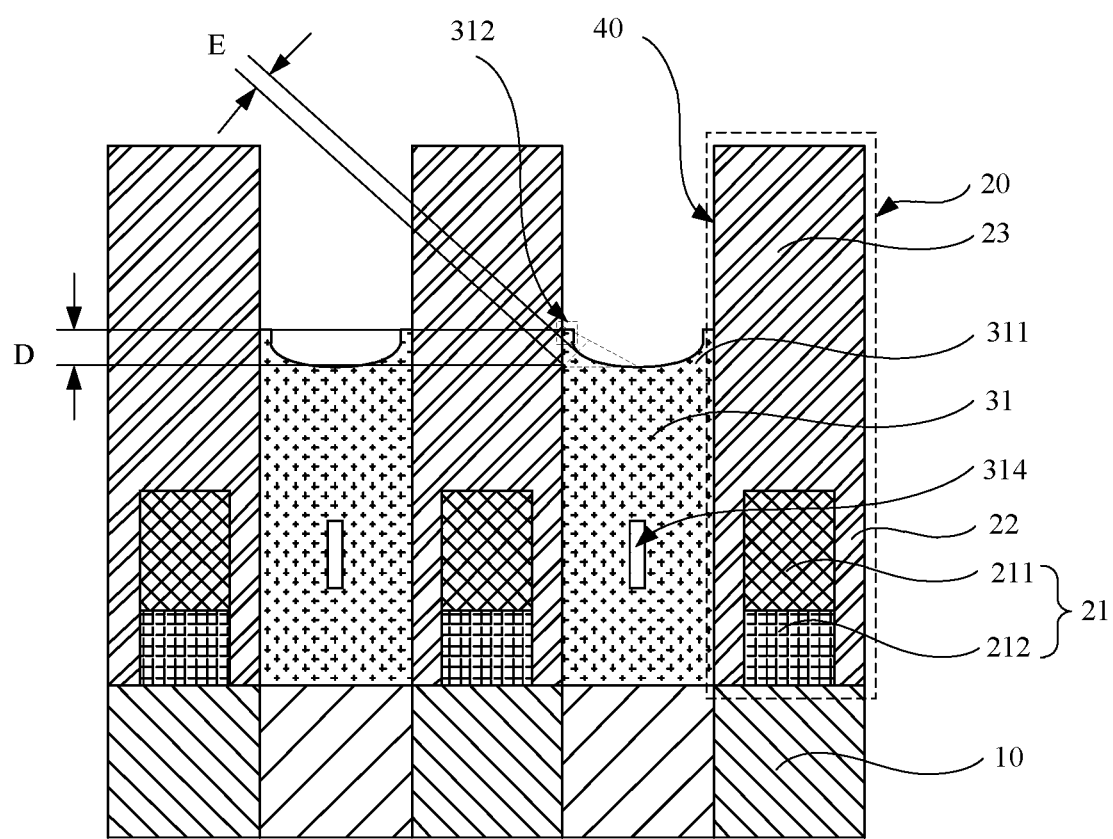
FIG. 12 is a schematic view of forming a chamfered structure in a method for manufacturing the semiconductor structure according to an embodiment of this disclosure.

With reference to FIG. 11 and FIG. 12, after the flaring structure 317 is formed, it is continued to deposit the conductive material on the top portion of the intermediate first conductive block 316 to form a conductive cover layer 318. The conductive cover layer 318 fills the seam 314 and the flaring structure 317, and covers the top portion of the intermediate first conductive block 316, so as to form the first conductive block 31, and form the chamfered structure 311 that is located on the top end of the first conductive block 31 and adjacent to the bit line structure 20.

In this embodiment, the following step is further included after the first conductive block 31 is formed.

In S104, the second conductive block is formed in the contact hole, the second conductive block is located on the top end of the first conductive block, and the bottom end of the second conductive block matches the chamfered structure.

In some embodiments, the top portion of the chamfered structure 311 has the transition wall 312, and the bottom end of the second conductive block 32 is inserted into a space enclosed by the transition wall 312. As shown in FIG. 11 and FIG. 12, the transition wall 312, the chamfered structure 311, and the first conductive block 31 are an integral structure. Exemplarily, the conductive cover layer 318 further covers the sidewall of the contact hole 40 and the top portion of the bit line structure 20. After the conductive cover layer 318 is formed, the conductive cover layer 318 located on the top portion of the bit line structure 20 and part of the sidewall of the contact hole 40 is removed so as to form the transition wall 312 located on the top end of the chamfered structure 311.

Through such a configuration, after the second conductive block 32 is formed, the transition wall 312 can increase a contact area between the first conductive block 31 and the second conductive block 32, and further reduce contact resistance between the first conductive block 31 and the second conductive block 32.

In some embodiments, the distance between the top end of the transition wall 312 and the top end of the first conductive block 31 is ⅓-½ of the distance between the adjacent bit line structures 20. With reference to FIG. 12, the distance between the top end of the transition wall 312 and the top end of the first conductive block 31 is D, the distance between the adjacent bit line structures 20 is the width of the contact hole 40, and D is ⅓-½ of the width of the contact hole 40.

Deposition is continued until a thickness of the conductive material is a width of the chamfered structure 311. As shown in FIG. 12, a distance E is the width of the chamfered structure 311. That is, a length of the chamfered structure 311 along the bisector of an angle, where a side of the chamfered structure 311 adjacent to the bit line structure 20 and a connection line between a center of the top end of the first conductive block 31 and the bit line structure 20 form a right angle, and the bisector of the angle is the bisector of the right angle.

Figure 13:
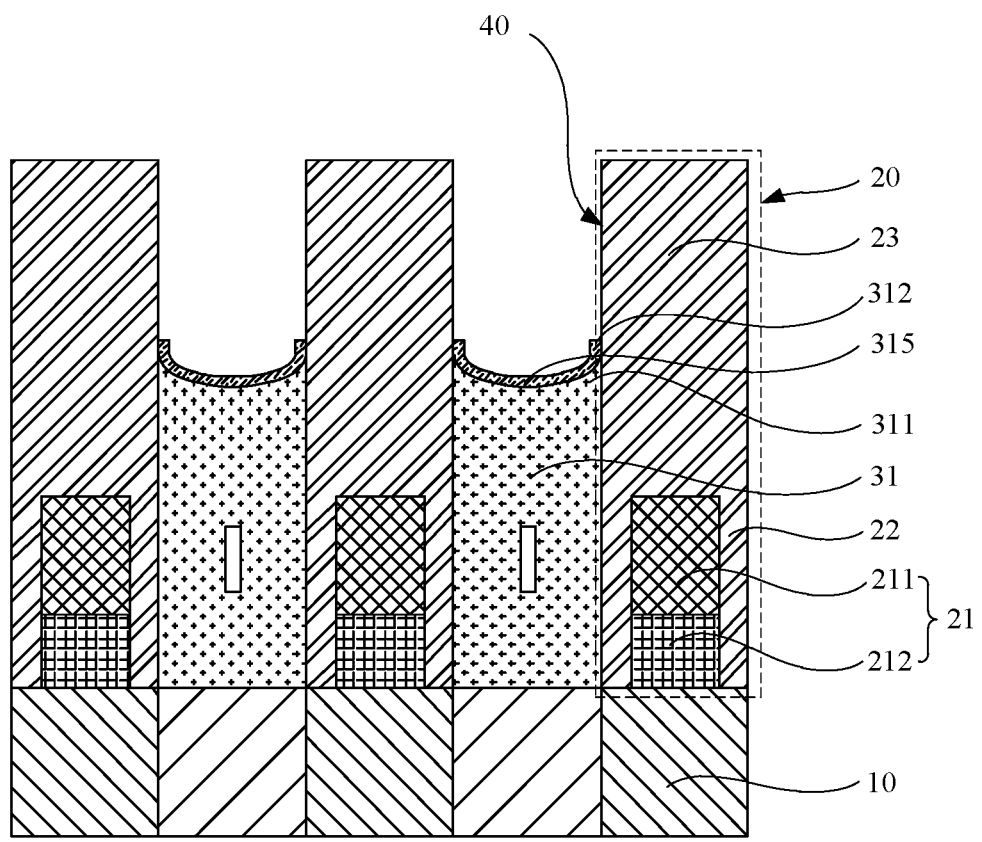
FIG. 13 is a schematic view of forming a contact layer in a method for manufacturing the semiconductor structure according to an embodiment of this disclosure.

In some embodiments, after the first conductive block 31 is formed, that is, before the second conductive block 32 is formed, forming the contact layer 315 is further included. With reference to FIG. 13, after the transition wall 312 is formed, the contact layer 315 is formed on the transition wall 312, the chamfered structure 311, and the top end of the first conductive block 31. The doped dopant is doped into the transition wall 312, the chamfered structure 311, and the top end of the first conductive block 31, so as to form the contact layer 315. Rapid thermal annealing is performed on the contact layer 315, such that the doped dopant is uniformly distributed on the transition wall 312, the chamfered structure 311, and the top end of the first conductive block 31. Exemplarily, the doped dopant can be deposited on the transition wall 312, the chamfered structure 311, and the top end of the first conductive block 31 via sputtering, then by using a rapid thermal annealing method, the doped dopant reacts with the conductive material to form the contact layer 315, and a mixture of a sulfuric acid and hydrogen peroxide, etc., is used as a cleaning solution to remove the unreacted doped dopant. The doped dopant can include phosphorus ions or arsenic ions.

Figure 14:
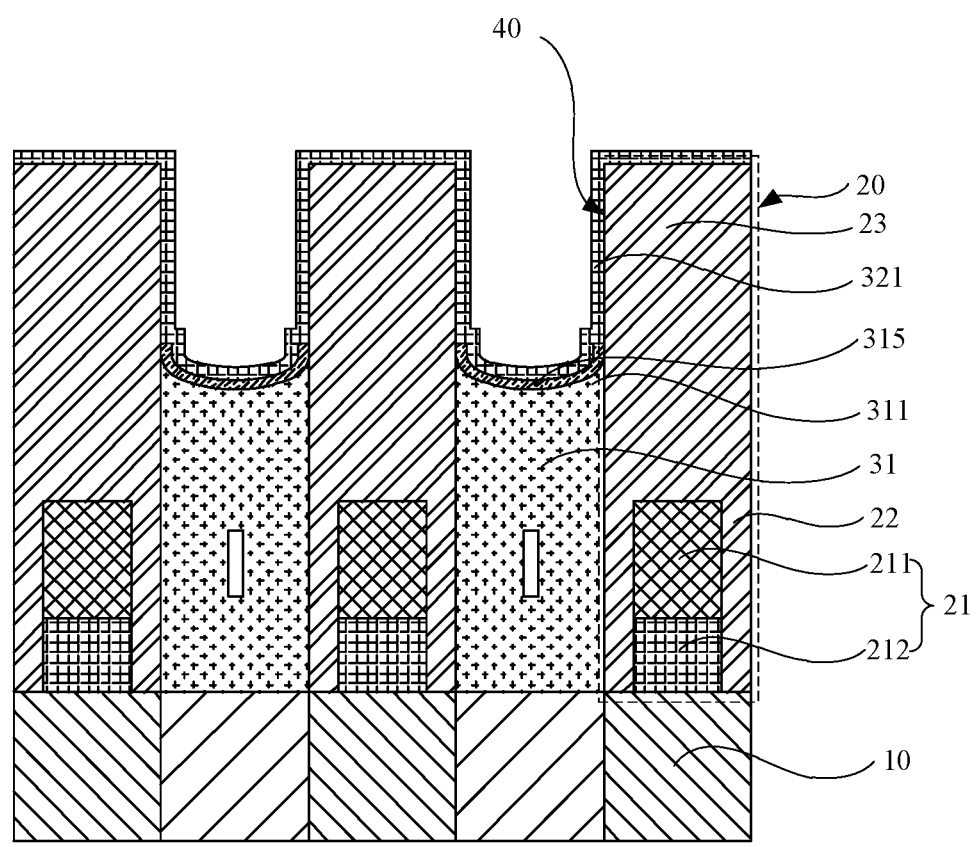
FIG. 14 is a schematic view of forming a conductive auxiliary layer in a method for manufacturing the semiconductor structure according to an embodiment of this disclosure.

With reference to FIG. 14, the conductive auxiliary layer 321 is formed on the contact layer 315. The conductive auxiliary layer 321 is deposited on the contact layer 315. The conductive auxiliary layer 321 covers the contact layer 315, and covers the insulating sidewall 22 of the bit line structure 20 and the top end of the insulating block 23. The conductive auxiliary layer 321 is configured to prevent a subsequently formed film structure and the contact layer 315 from inter-penetrating. The chemical vapor deposition method or a thin film deposition method can be selected as the deposition method. The material of the conductive auxiliary layer 321 can include a metal nitride, such as titanium nitride.

Figure 15:
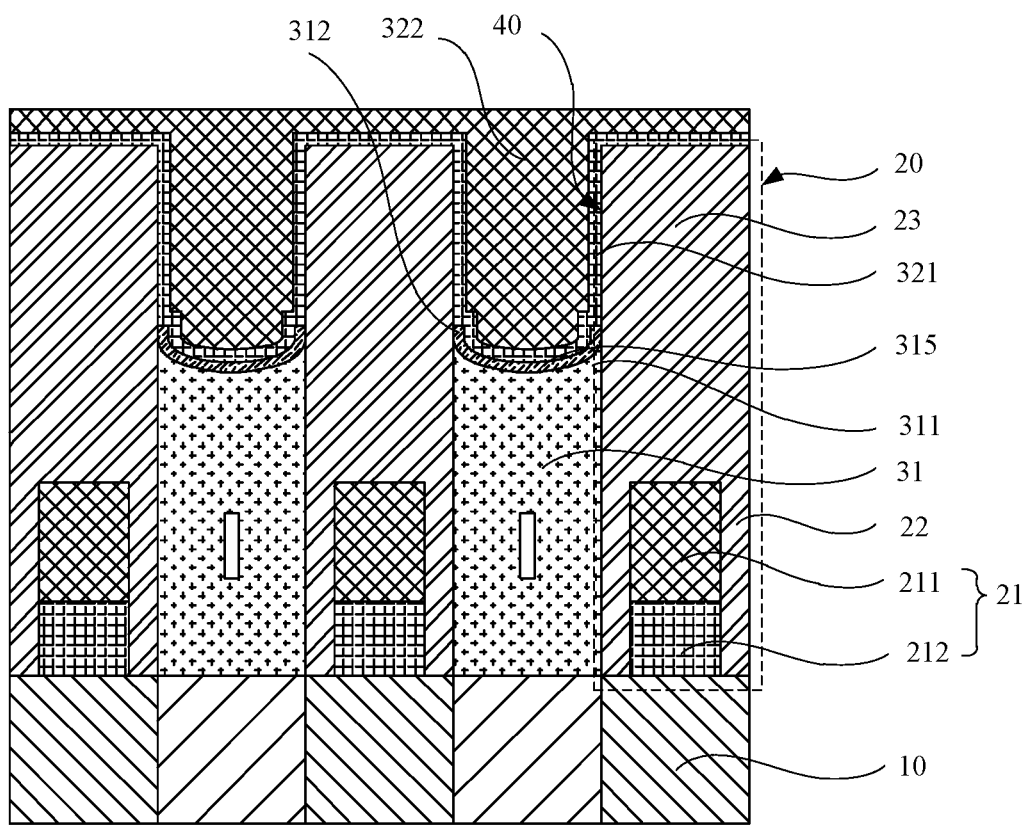
FIG. 15 is a schematic view of forming a conductive plug in a method for manufacturing the semiconductor structure according to an embodiment of this disclosure.

The conductive plug 322 is formed on the conductive auxiliary layer 321. With reference to FIG. 15, the conductive plug 322 is deposited and formed on the conductive auxiliary layer 321, and fills the contact hole 40. The chemical vapor deposition method or the thin film deposition method can be selected as the deposition method. The material of the conductive plug 322 can include a conductive metal, such as tungsten and titanium.

Figure 16:
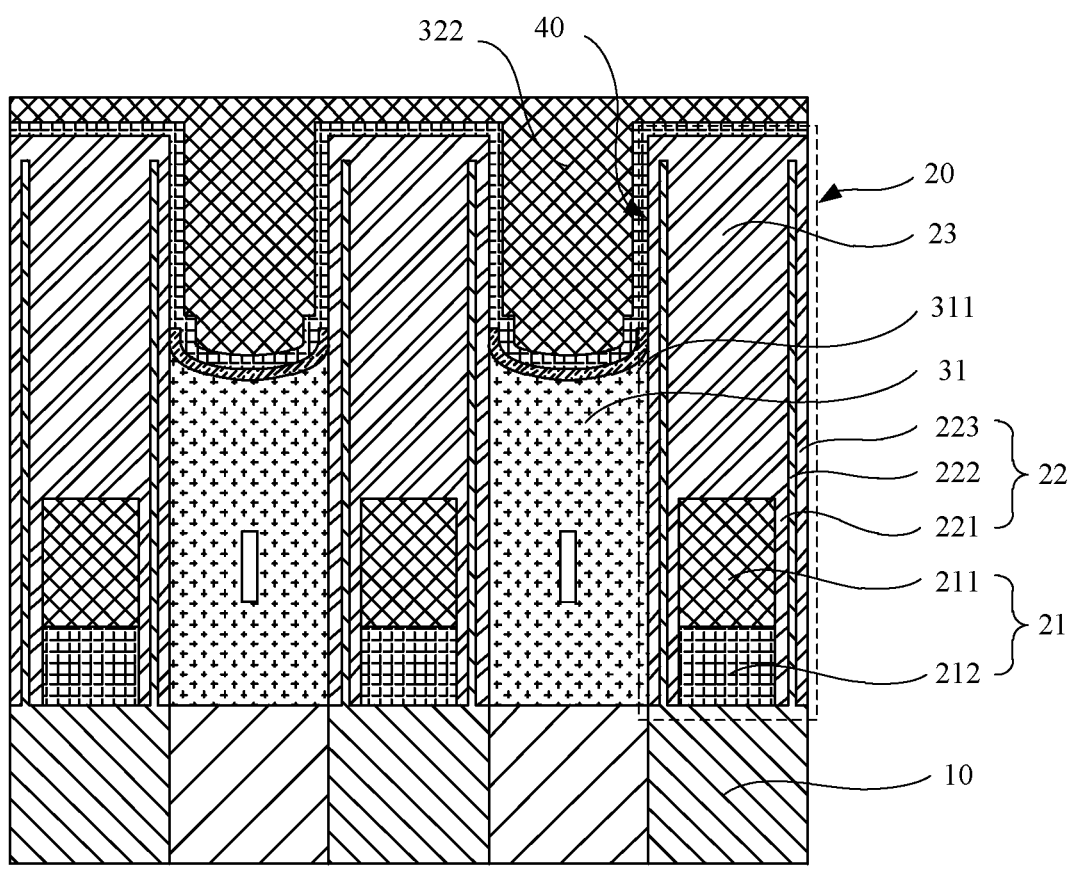
FIG. 16 is a schematic sectional view of forming a semiconductor structure according to a method for manufacturing the semiconductor structure according to another embodiment of this disclosure.

With reference to FIG. 16, in some embodiments, the insulating sidewall 22 is formed on the side surface of a bit line 21 and the side surface of a insulating block 23, including: forming a first insulating sidewall 221, a second insulating sidewall 222, and a third insulating sidewall 223 that are sequentially stacked on the side surface of the bit line 21 and the side surface of the insulating block 23, the materials of the first insulating sidewall 221 and the third insulating sidewall 223 being identical, and the materials of the second insulating sidewall 222 and the first insulating sidewall 221 being different. Such a configuration can prevent the formation of a capacitor between the bit line and any other conductive structure, and at the same time prevent producing leakage current between the bit line and any other conductive structure.

The foregoing descriptions are merely specific embodiments of this disclosure, but are not intended to limit the scope of protection of this disclosure. Any variation or replacement readily conceived of by persons skilled in the art who are familiar with the technical field disclosed in this disclosure shall fall within the scope of protection of this disclosure Therefore, the scope of protection of this disclosure shall be subject to the claims.

What is claimed is:

1. A semiconductor structure, comprising: a substrate, a plurality of bit line structures and a plurality of capacitor connection lines, wherein
    the plurality of the bit line structures are arranged on the substrate and extend on a top surface of the substrate;
    the plurality of bit line structures are disposed in parallel and spaced apart from each other on the top surface of the substrate; a plurality of contact holes are formed between two adjacent ones of the plurality of the bit line structures;
    each of the plurality of the capacitor connection lines comprises a first conductive block and a second conductive block sequentially filled in each of the plurality of the contact holes; a chamfered structure is formed on a top end of the first conductive block; the chamfered structure is adjacent to the two adjacent ones of the plurality of the bit line structures; and a bottom end of the second conductive block matches the chamfered structure,
wherein the chamfered structure has a chamfered rounded angle, and
the chamfered structure further has a transition wall; the transition wall is located at a top end of the chamfered rounded angle; the transition wall is adjacent to the two adjacent ones of the plurality of the bit line structures; and the chamfered structure and the first conductive block are an integral structure.

2. The semiconductor structure of claim 1, wherein a distance between a top end of the transition wall and the top end of the first conductive block is ⅓-½ of a distance between the two adjacent one of the plurality of bit line structures.

3. The semiconductor structure of claim 1, wherein a doped dopant is doped into the transition wall, the chamfered structure and the top end of the first conductive block, so as to form a contact layer that is in contact with the second conductive block.

4. The semiconductor structure of claim 3, wherein the doped dopant comprises phosphorus ions or arsenic ions.

5. The semiconductor structure of claim 1, wherein each of the plurality of the bit line structures comprises a bit line, an insulating block, and an insulating sidewall; the bit line is provided on the top surface of the substrate and extends on the top surface of the substrate; the insulating block covers a top end of the bit line; the insulating sidewall covers a side surface of the bit line.

6. The semiconductor structure of claim 5, wherein a distance between the top end of the bit line and the top surface of the substrate is smaller than a distance between the top end of the first conductive block and the top surface of the substrate.

7. The semiconductor structure of claim 5, wherein there is a gap in the insulating sidewall; the gap is filled with an insulating filler; and a material of the insulating filler is different from that of the insulating sidewall.

8. The semiconductor structure of claim 1, further comprising: a plurality of insulating structures, in which the plurality of the insulating structures are formed on the top surface of the substrate; the plurality of the insulating structures are filled between two adjacent ones of the plurality of the bit line structures; and the plurality of insulating structures and the two adjacent ones of the bit line structures define the plurality of the contact holes and the plurality of contact holes exposes the substrate.

9. A semiconductor structure, comprising: a substrate, a plurality of bit line structures and a plurality of capacitor connection lines, wherein
the plurality of the bit line structures are arranged on the substrate and extend on a top surface of the substrate;
the plurality of the bit line structures are disposed in parallel and spaced apart from each other on the top surface of the substrate; a plurality of contact holes are formed between two adjacent ones of the plurality of the bit line structures;
each of the plurality of the capacitor connection lines comprises a first conductive block and a second conductive block sequentially filled in each of the plurality of the contact holes; a chamfered structure is formed on a top end of the first conductive block; the chamfered structure is adjacent to the two adjacent ones of the plurality of the bit line structures; and a bottom end of the second conductive block matches the chamfered structure,
wherein the second conductive block comprises a conductive auxiliary layer and a conductive plug; the conductive auxiliary layer covers the top end of the first conductive block, a top end of the chamfered structure, and a sidewall of the contact hole; and the conductive plug is formed on the conductive auxiliary layer and fills the contact hole.

10. A method for manufacturing a semiconductor structure, comprising:
providing a substrate;
forming a plurality of bit line structures on the substrate, wherein the plurality of the bit line structures extend on a top surface of the substrate, the plurality of the bit line structures are disposed on the top surface of the substrate in parallel and spaced apart from each other, and a plurality of contact holes are formed between two adjacent ones of the plurality of the bit line structures;
forming a first conductive block in each of the plurality of the contact holes, and forming a chamfered structure on a top end of the first conductive block, wherein, the chamfered structure has a chamfered rounded angle; the chamfered structure is adjacent to the two adjacent ones of the plurality of the bit line structures, and the chamfered structure further has a transition wall; the transition wall is located at a top end of the chamfered rounded angle; the transition wall is adjacent to the two adjacent ones of the plurality of bit line structures; and the chamfered structure and the first conductive block are an integral structure; and
forming a second conductive block in the contact hole, wherein the second conductive block is located on the top end of the first conductive block, and a bottom end of the second conductive block matches the chamfered structure.

11. The method for manufacturing the semiconductor structure of claim 10, wherein said forming the first conductive block in each of the plurality of the contact holes comprises:
filling a conductive material in the contact hole to fill up the contact hole, and a seam is formed in the conductive material;
removing a portion of the conductive material to expose a portion of the seam, so as to form an intermediate first conductive block located in the contact hole;
etching a top portion of the intermediate first conductive block to form a flaring structure on a top portion of the seam; and
forming a conductive cover layer on the top portion of the intermediate first conductive block, wherein the conductive cover layer fills the seam and the flaring structure, and covers the top portion of the intermediate first conductive block, so as to form the first conductive block, and form the chamfered structure located on the top end of the first conductive block and adjacent to the two adjacent ones of the plurality of the bit line structures.

12. The method for manufacturing the semiconductor structure of claim 11, wherein the conductive cover layer further covers a sidewall of the contact hole and a top portion of the two adjacent ones of the plurality of the bit line structures; and
after the conductive cover layer is formed, the conductive cover layer located on the top portion of the two adjacent ones of the plurality of the bit line structures and part of the sidewall of the contact hole is removed so as to form the transition wall located on the top end of the chamfered structure.

13. The method for manufacturing the semiconductor structure of claim 12, further comprising: prior to said forming the second conductive block,
doping the transition wall, the chamfered structure, and the top end of the first conductive block with a doped dopant, so as to form a contact layer; and
performing rapid thermal annealing on the contact layer.

14. The method for manufacturing the semiconductor structure of claim 13, wherein the doped dopant comprises phosphorus ions or arsenic ions.

15. The method for manufacturing the semiconductor structure of claim 10, wherein said forming the plurality of the bit line structures on the substrate comprises:
forming a bit line layer and an insulating layer that are sequentially stacked on the substrate;
etching the bit line layer and the insulating layer along a direction perpendicular to the substrate, so as to form the plurality of the bit lines that are disposed in parallel and spaced apart from each other on the substrate, and a plurality of insulating blocks covering the plurality of the bit lines; and
forming insulating sidewalls on side surfaces of the plurality of the bit lines and side surfaces of the plurality of the insulating blocks.

16. The method for manufacturing the semiconductor structure of claim 15, wherein said forming the insulating sidewalls on the side surfaces of the plurality of the bit lines and the side surfaces of the plurality of the insulating blocks comprises:
forming a first insulating sidewall, a second insulating sidewall, and a third insulating sidewall that are sequentially stacked on the side surfaces of each of the plurality of the bit lines and the side surfaces of each of the plurality of the insulating blocks, materials of the first insulating sidewall and the third insulating sidewall being identical, and materials of the second insulating sidewall and the first insulating sidewall being different.

\* \* \* \* \*